US009253934B2

(12) United States Patent
Onodera et al.

(10) Patent No.: US 9,253,934 B2
(45) Date of Patent: Feb. 2, 2016

(54) CIRCUIT DEVICE AND INKJET HEAD ASSEMBLY

(71) Applicant: FUJIFILM CORPORATION, Tokyo (JP)

(72) Inventors: Daisuke Onodera, Kanagawa (JP); Akira Wakabayashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 121 days.

(21) Appl. No.: 13/921,995

(22) Filed: Jun. 19, 2013

(65) Prior Publication Data

US 2013/0342608 A1  Dec. 26, 2013

(30) Foreign Application Priority Data

Jun. 20, 2012 (JP) ................................ 2012-139120

(51) Int. Cl.
*H05K 10/00* (2006.01)
*B41J 2/01* (2006.01)
*B41J 2/14* (2006.01)
*B41J 2/045* (2006.01)

(52) U.S. Cl.
CPC . *H05K 10/00* (2013.01); *B41J 2/01* (2013.01); *B41J 2/14233* (2013.01); *B41J 2002/14362* (2013.01); *B41J 2002/14491* (2013.01); *B41J 2202/12* (2013.01)

(58) Field of Classification Search
USPC ......................... 174/250; 347/50, 68; 438/21; 257/E21.002
See application file for complete search history.

(56) References Cited

U.S. PATENT DOCUMENTS

| 5,689,878 | A | 11/1997 | Dahringer et al. |
| 6,313,653 | B1 * | 11/2001 | Takahashi et al. ........ 324/750.06 |
| 6,342,788 | B1 * | 1/2002 | McAllister et al. ...... 324/750.11 |
| 8,147,040 | B2 | 4/2012 | Menzel et al. |
| 8,591,003 | B2 * | 11/2013 | Kusakari et al. ................. 347/40 |
| 2002/0130930 | A1 * | 9/2002 | Moriya et al. ................... 347/70 |
| 2005/0001881 | A1 * | 1/2005 | Nakashima et al. ............ 347/50 |
| 2010/0220146 | A1 * | 9/2010 | Menzel et al. ................... 347/40 |
| 2011/0139901 | A1 * | 6/2011 | Menzel et al. ................ 239/398 |

FOREIGN PATENT DOCUMENTS

| JP | H09-512134 A | 12/1997 |
| JP | H10-051173 A | 2/1998 |

(Continued)

OTHER PUBLICATIONS

An Office Action; "Notification of Reasons for Rejection," issued by the Japanese Patent Office on Aug. 4, 2014, which corresponds to Japanese Patent Application No. 2012-139120 and is related to U.S. Appl. No. 13/921,995; with English language partial translation.

(Continued)

*Primary Examiner* — Timothy Thompson
*Assistant Examiner* — Michael F McAllister
(74) *Attorney, Agent, or Firm* — Studebaker & Brackett PC

(57) ABSTRACT

A circuit device according to an aspect of the present invention includes a circuit board which has one or more wiring layers formed on a base material and has an insulating layer laminated on a surface of the base material opposite to the one or more wiring layers, and a guiding member which is configured to encircle at least a part of an end face of the circuit board so that a space is formed with the end face and to guide movement of a dried body which is supplied to the formed space.

11 Claims, 14 Drawing Sheets

(56) References Cited

FOREIGN PATENT DOCUMENTS

| | | |
|---|---|---|
| JP | 2006-255973 A | 9/2006 |
| JP | 2009-262421 A | 11/2009 |
| JP | 2010-086992 A | 4/2010 |
| JP | 2012-076309 A | 4/2012 |
| WO | 95/28072 A1 | 10/1995 |
| WO | 2010/099418 A1 | 9/2010 |

OTHER PUBLICATIONS

The extended European search report issued on Sep. 9, 2013, which corresponds to EP13173008.7 and is related to U.S. Appl. No. 13/921,995.

Communication pursuant to Article 94(3) EPC issued by the European Patent Office on Oct. 29, 2014, which corresponds to European Patent Application No. 13173008.7-1701 and is related to U.S. Appl. No. 13/921,995.

* cited by examiner

|  | CONDITION | NUMBER OF DAYS UNTIL OCCURRENCE OF FAILURE (SHORT CIRCUIT) |
|---|---|---|
| EXAMPLE | ONLY AN END IS DRIED | 90 DAYS OR MORE |
| COMPARATIVE EXAMPLE 1 | RESIN LAYER | 56 |
| COMPARATIVE EXAMPLE 2 | RESIN LAYER IS COATED WITH WATER GLASS AND WATER GLASS LAYER IS DRIED | 11 |
| COMPARATIVE EXAMPLE 3 | ONLY RESIN LAYER (NO DRYING) | 3 |
| COMPARATIVE EXAMPLE 4 | COPPER WIRING IS EXPOSED (NO DRYING) | 0 |

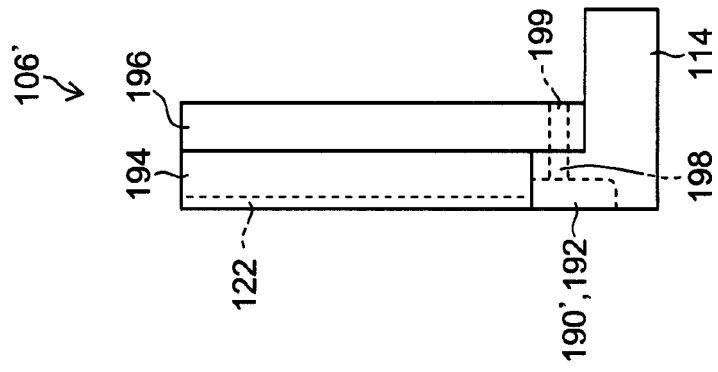
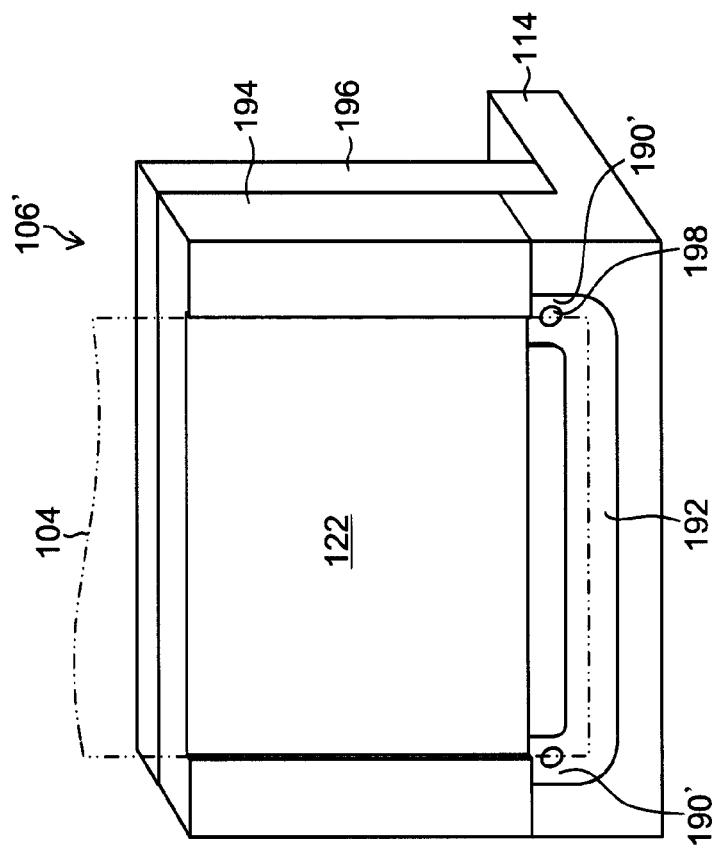

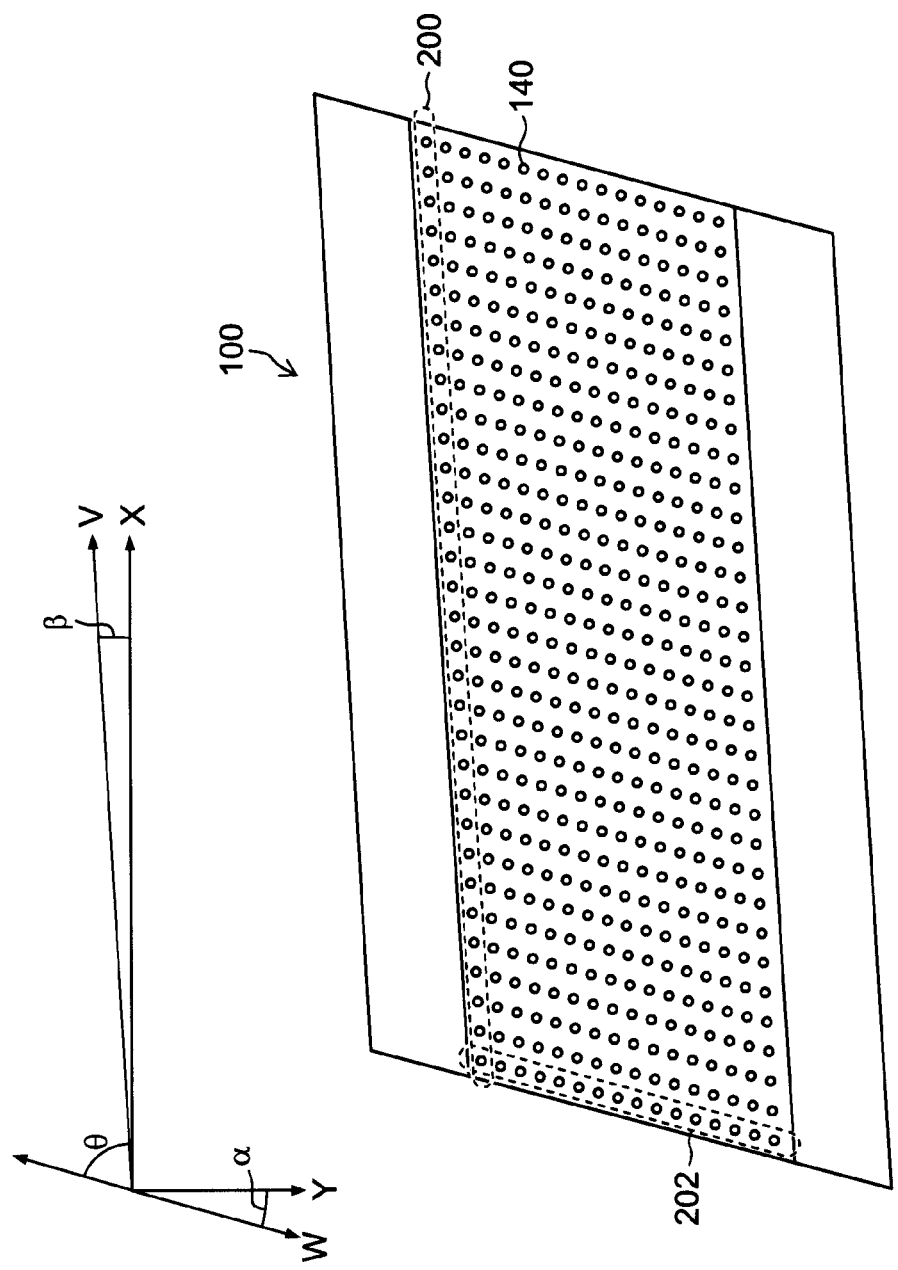

US 9,253,934 B2

CIRCUIT DEVICE AND INKJET HEAD ASSEMBLY

BACKGROUND OF THE INVENTION

1. Field of the Invention

The present invention relates to a circuit device and an inkjet head assembly, and more particularly relates to a technology for protecting an electrical wiring pattern on a circuit board.

2. Description of the Related Art

There is known a circuit board configured to include a base material, such as a resin film and glass epoxy, a thin film made of a metallic material, such as copper, formed on the base material, an electrical wiring pattern formed by patterning the metal film by etching or other methods, and further a coating made of an insulating material, such as a solder resist, for coating the electrical wiring pattern.

The circuit board is widely used in industrial equipment and/or consumer equipment. Thus, as the circuit board is used in various applications and environments, the use environments of the circuit board are assumed to include a high-humidity environment, a high-temperature environment, and an environment where foreign materials, such as powder dust, are present.

Such environments may cause a problem of a short circuit or an open circuit between electrical wirings due to degradation of insulating materials and a problem of a short circuit of the electrical wiring caused by water and foreign materials intruding in between an insulating layer and a base material.

In general, when the circuit board is used in the high-humidity environment and the environment involving a large amount of foreign materials (materials having conductivity in particular), long-term reliability (resistance) becomes an issue. Since an electrical wiring pattern is coated with an insulating material in order to prevent a short circuit and an open circuit of the electrical wiring pattern, the reliability is not an issue in a short term use. However, in the case where the circuit board is used over a long period of time, further measures need to be taken in a viewpoint of assuring long-term reliability.

Described in Japanese Patent Application Laid-Open No. 2010-86992 is a board having conductive patterns formed thereon and a semiconductor element mounted thereon, in which a semiconductor element mounting surface of the board is coated with sealing resin, and the surface of a coating film (solder resist film) for coating the conductive patterns is coated with a glass film.

Such configuration suppresses an intrusion of water into the coating layer and prevents a short circuit between the conductive patterns.

SUMMARY OF THE INVENTION

However, while the circuit device described in Japanese Patent Application Laid-Open No. 2010-86992 can prevent the short circuit of the conductive patterns which may occur due to an intrusion of water from the board surface (semiconductor element mounting surface) after use of the circuit device for relatively a short time, there is still concern about occurrence of a failure attributed to electrochemical migration which is caused by deterioration of the sealing resin due to long-term use and which is gradually advanced.

The term "electrochemical migration" herein refers to a phenomenon in which ion migration is generated and grown, due to an electrochemical phenomenon, in an originally sufficient insulating material in a printed board or the like in the state of receiving application of electric bias voltage, as a result of which a short circuit occurs between electrodes and between wirings.

The present invention has been made in view of such circumstances, and it is an object of the present invention to provide a circuit device and an inkjet head assembly capable of preventing occurrence of a failure attributed to a short circuit and the like of the circuit board even in the case of being used for a long period of time under a relatively high-humidity environment.

In order to accomplish the above object, a circuit device according to the present invention includes: a circuit board which has one or more wiring layers formed on a base material and has an insulating layer laminated on a surface of the one or more wiring layers opposite to the base material; and a guiding member which is configured to encircle at least a part of an end face of the circuit board so that a space is formed with the end face and to guide movement of a dried body which is supplied to the formed space.

According to the present invention, the dried body is brought into contact with the end portion of the circuit board while movement of the dried body is guided by the guiding member. This makes it possible to prevent an intrusion of water (moisture) to the inside from the end face of the circuit board, and to prevent occurrence of a failure attributed to a short circuit between wirings resulting from electrochemical migration.

BRIEF DESCRIPTION OF THE DRAWINGS

FIGS. 16A and 16B are perspective views showing another internal configuration example of the mounting frame of FIG. 15;

FIG. 17 is a plan view showing nozzle arrangement of an inkjet head assembly.

DETAILED DESCRIPTION OF THE PREFERRED EMBODIMENTS

Hereinafter, an embodiment for carrying out the present invention is described in detail with reference to the accompanying drawings.

[Description of Circuit Device]

(Overall Configuration)

Figure 1:
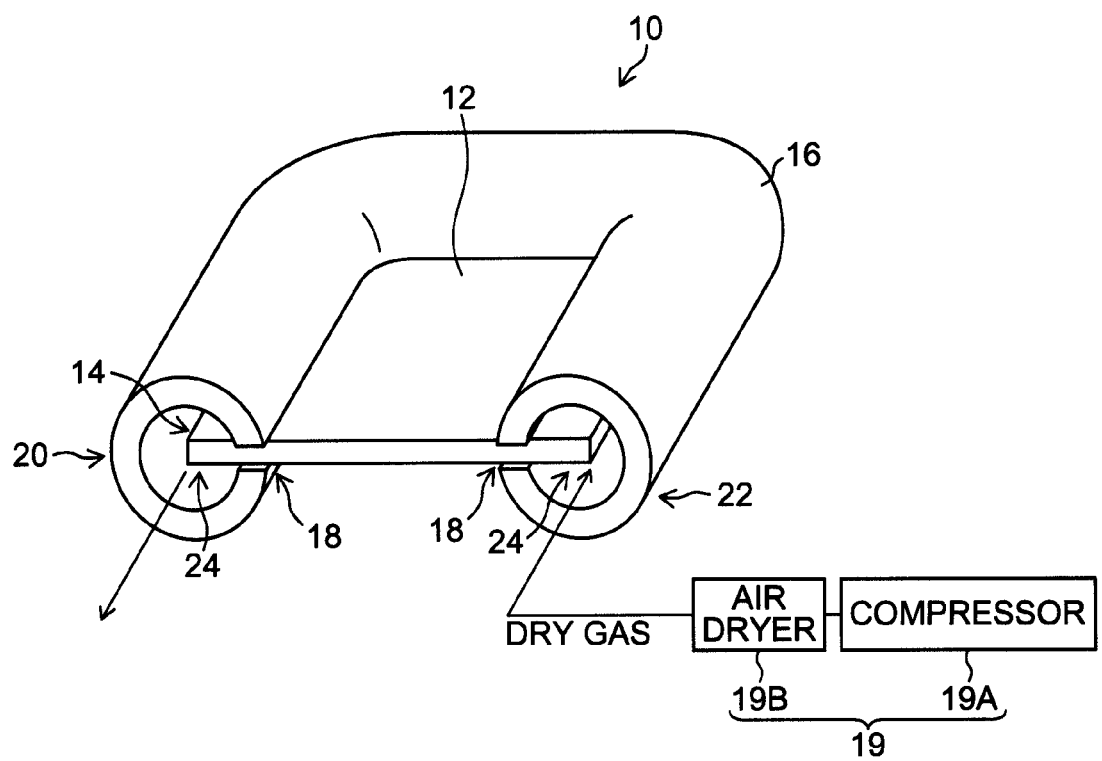
FIG. 1 is a schematic configuration view of a circuit device according to an embodiment of the present invention.

FIG. 1 is a schematic configuration view of a circuit device according to an embodiment of the present invention. A circuit device 10 shown in FIG. 1 includes a circuit board 12 and a guiding member 16 for guiding movement of dry gas so as to bring the dry gas into contact with an end face 14 of the circuit board 12.

As described later in detail, the circuit board 12 is configured to have a wiring layer (not shown in FIG. 1, shown in FIG. 2 with reference numeral 32) coated with an insulating layer (not shown in FIG. 1, shown in FIG. 2 with reference numeral 34), and the end face 14 is exposed at the end of the base material, at the end of the wiring layer, and at the end of the insulating layer.

The term "end face" of the circuit board 12 herein refers to a surface which intersects (which is orthogonal to) an insulating layer forming surface.

The guiding member 16 has a hollow structure in a cylindrical shape, and has a notch portion 18 formed for sandwiching the circuit board 12. More specifically, the guiding member 16 has a ring shaped cross section with a part of the ring shape being missing.

In the aspect shown in FIG. 1, three sides of the end face 14, out of four sides of the end face 14 of the circuit board 12 which has a square plane shape, are covered with the guiding member 16. Dry gas is supplied from one end 20 or the other end 22 of the guiding member 16 to the inside of the guiding member 16 so that the dry gas is filled in the guiding member 16. The guiding member 16 guides movement of the dry gas so as to bring the dry gas into contact with the end face 14 of the circuit board 12 covered with the guiding member 16.

In the circuit device 10 shown in this embodiment, at least a part of the end face 14 of the circuit board 12 needs to be covered with the guiding member 16. Accordingly, as shown in FIG. 1, it is possible to adopt the configuration in which a peripheral portion 24 of the circuit board 12 is covered with the guiding member 16.

A width of the peripheral portion 24 of the circuit board 12 (an area of the peripheral portion 24 of the circuit board 12, a region covered with the guiding member 16 as the peripheral portion 24 of the circuit board 12) may be determined from a viewpoint of mounting of the guiding member 16, or be determined from a viewpoint of the configuration (a wiring pattern forming region, etc.) of the circuit board 12. For example, it is possible to define a region, from the end face 14 of the circuit board 12 to a length of the thickness of the guiding member 16, as the peripheral portion 24 from a viewpoint of mounting of the guiding member 16, and it is possible to define a region where a wiring pattern is not formed (a non-wiring pattern forming region) as the peripheral portion 24 from a viewpoint of the configuration of the circuit board 12.

The term "dry gas" herein refers to a gas which has a humidity at least less than the atmospheric humidity of the circuit board 12. As the dry gas, mixture gas like air may be applied, or single gas may also be applied.

As shown in FIG. 1, the guiding member 16 may have an opening formed on both the ends 20 and 22, and may have an opening formed only on the one end 20 (or 22). By forming an opening on both the ends 20 and 22 of the guiding member 16, dry gas is supplied from the opening on the one end 20, and the dry gas having being in contact with the end face 14 of the circuit board 12 is discharged from the opening on the other end 22, so that the dry gas is maintained in a sufficient dry state.

A publicly known dehumidification apparatus is applicable as a device which generates dry gas. For example, a dehumidification apparatus 19 including a compressor 19A and an air dryer 19B, the compressor 19A may be operated to send compressed air to the air dryer 19B, and the air dryer 19B may be operated to generate dry gas. Both refrigeration type and filter type air dryers are applicable as the air dryer 19B. Such configuration of the dehumidification apparatus 19 can be adopted in other aspects/embodiments explained below.

Figure 2:
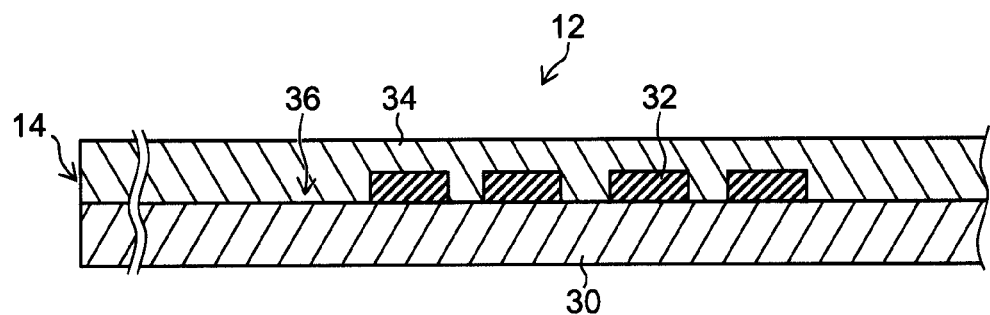
FIG. 2 is a cross sectional view showing a configuration example of the circuit board shown in FIG. 1.

FIG. 2 is a cross sectional view showing a configuration example of the circuit board 12 shown in FIG. 1. In the circuit board 12 shown in FIG. 2, the wiring layer 32 is formed on one surface of a base material 30, and the wiring layer 32 and a surface 36 of the base material 30 with the wiring layer 32 formed thereon are coated with the insulating layer 34.

A surface 38 of the base material 30, which is opposite to the surface having the wiring layer 32 formed thereon, may be coated with the insulating layer 34.

The end face 14 of the circuit board 12 is exposed without being coated at the end of the base material 30 and at the end of the insulating layer 34.

As the base material 30, materials, such as a resin film, glass epoxy, paper (impregnated with phenol resin), and ceramics, are applicable. As the wiring layer, materials, such as copper, gold, silver, and platinum, which are high in electric conductivity and are patternable by etching, and the like, are applicable. As the insulating layer 34, insulating materials, such as epoxy resin (solder resist) having good insulation, are applicable.

In the circuit device 10 shown in this embodiment, the dry gas is brought into contact with the end face 14 of the circuit board 12, so that the atmosphere on the end face 14 of the circuit board 12 and in the vicinity thereof is maintained in a dry state. More specifically, an intrusion of water (moisture) to the inside of the circuit board 12 from the end face 14 of the circuit board 12 along the interface 36 between the base material 30 and the insulating layer 34 is prevented.

By preventing the intrusion of water to the inside of the circuit board 12, a failure due to electrochemical migration caused by water reaching the wiring layer 32 and a current passing to the wiring layer 32 is prevented.

(Description of Operational Effect of Circuit Device)

A description is now given of the operational effect in the case (example) where dry gas is brought into contact with the end face 14 (see FIGS. 1 and 2) of the circuit board 12 in comparison with comparative examples 1 to 4.

FIGS. 3A to 3D are explanatory views of the comparative examples 1 to 4. FIG. 4 is an explanatory view of the effect of the circuit device 10 shown in FIG. 1 in the form of a table that indicates the evaluation result of an evaluation experiment described below.

In the evaluation experiment, a period of time from the start of use of a printed-circuit board (start of application of voltage) to occurrence of a failure (short circuit) was examined under every environmental condition and printed-circuit board condition. As the printed-circuit boards for use in the example and in the comparative examples 1 and 3 (FIGS. 3A and 3C), the circuit board 12 shown in FIG. 2 is applied. Other conditions are as explained below.

"A region other than the peripheral portion 24 of the circuit board 12" in the example and the comparative examples 1 to 4 refers to a region with the wiring pattern formed thereon (a region where the wiring layer 32 is not removed).

The circuit device 10 described in the foregoing can be applied as a device which supports a printed-circuit board used for various applications, and as a device which protects the printed-circuit board.

EXAMPLE

As the guiding member 16 (see FIG. 1), a tube made of polyvinyl chloride (PVC) (10 millimeters in diameter) is applied. A part of a peripheral portion of the tube is cut open along a central axis to form a notch portion (shown in FIG. 1 with reference numeral 18).

Figure 6:
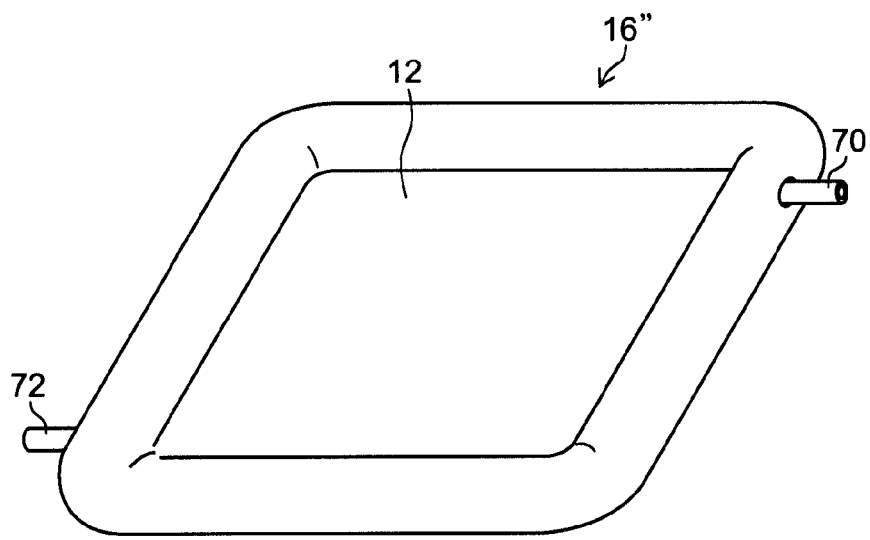
FIG. 6 is an explanatory view of another aspect of the guiding member shown in FIG. 1.

Respective sides of the circuit board 12 (see FIG. 1) are inserted into the notch portion 18, so that all the end faces of the circuit board 12 are coated with the guiding member 16 (see FIG. 6).

A contact interface between the surface (surface having the wiring layer 32 formed thereon and being covered with the insulating layer 34) of the circuit board 12 and the guiding member 16, and a contact interface between the back surface of the circuit board 12 and the guiding member 16 are sealed with adhesives provided thereto.

The circuit board 12 with the guiding member 16 mounted thereon is put in an unshown constant temperature/constant humidity chamber (85° C., 85% (RH)) and a direct voltage of 12 volts is applied thereto. Dry gas (85° C., 25% (RH)) is supplied to the inside of the guiding member 16 and is circulated therein so that a constant temperature/constant humidity environment of 85° C. and 25% (RH) is maintained in the inside of the guiding member 16.

Comparative Example 1

As in the example described in the foregoing, the circuit board 12 shown in FIG. 2 is used as a printed-circuit board.

Figure 3A:
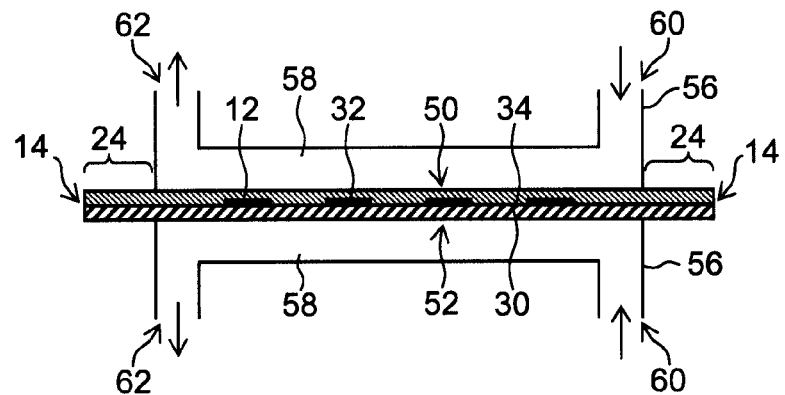
FIG. 3A is an explanatory view of a comparative example 1.
Figures 4, 5:
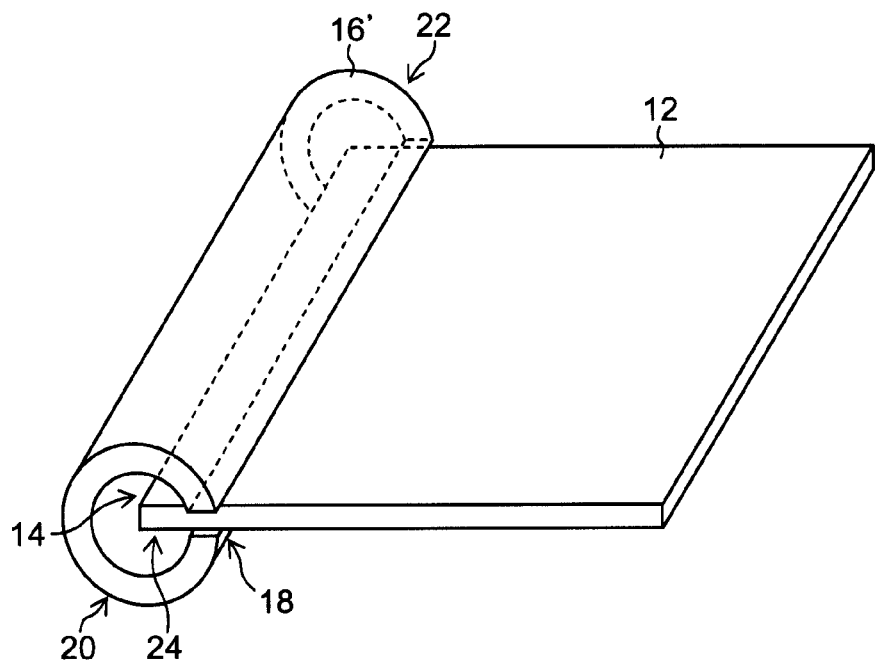
FIG. 4 is an explanatory view of an operational effect of the circuit device shown in the present embodiment.
FIG. 5 is an explanatory view of another aspect of a guiding member shown in FIG. 1.

As shown in FIG. 3A, a sealing member 56 is mounted on a part other than the peripheral portion 24 so as to remain the peripheral portion 24 (in the vicinity of the end face 14) of a surface 50 and a back surface 52 of the circuit board 12.

The sealing member 56 has a space portion 58 formed in the inside and has flow channel portions 60 and 62 formed so as to communicate with the space portion 58.

The circuit board 12 with the sealing member 56 mounted thereon is put in the constant temperature/constant humidity chamber (85° C., 85% (RH)) under the environment conditions set same as those in the example, and a direct voltage of 12 volts is applied to the wiring layer 32. Dry gas (85° C., 25% (RH)) is supplied to the inside of the sealing member 56 and is circulated therein so that a constant temperature/constant humidity environment of 85° C. and 25% (RH) is maintained in the inside of the sealing member 56.

In other words, in the comparative example 1, the end face 14 and the peripheral portion 24 of the circuit board 12 were put in the high-humidity environment (85% (RH)), while other sections other than the end face 14 and the peripheral portion 24 of the circuit board 12 were put in the low-humidity environment (25% (RH)).

Comparative Example 2

Figure 3B:
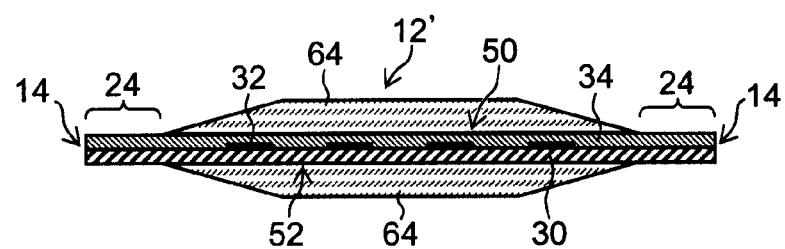
FIG. 3B is an explanatory view of a comparative example 2.

As shown in FIG. 3B, a circuit board 12' is applied in the comparative example 2, in which a section other than the peripheral portion 24 of the surface 50 and the back surface 52 of the circuit board 12 shown in FIG. 2 is coated with water glass 64.

The circuit board 12' which is coated with the water glass 64 except the peripheral portion 24 is put in the constant temperature/constant humidity chamber (85° C., 85% (RH)) under the environment conditions set same as those in the example, and a direct voltage of 12 volts is applied to the wiring layer 32.

Comparative Example 3

Figure 3C:
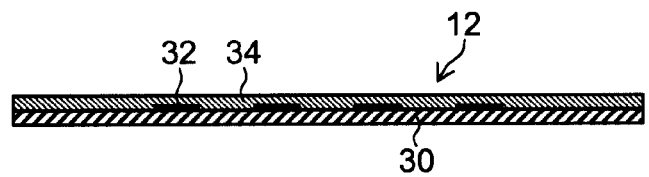
FIG. 3C is an explanatory view of a comparative example 3.

As shown in FIG. 3C, the circuit board 12 shown in FIG. 2 is applied in the comparative example 3, though this circuit board 12 does not have the guiding member 16 mounted thereon. The circuit board 12 is put in the constant temperature/constant humidity chamber (85° C., 85% (RH)) under the environment conditions set same as those in the example, and a direct voltage of 12 volts is applied to the wiring layer 32.

Comparative Example 4

Figure 3D:
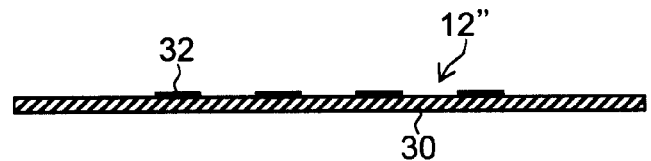
FIG. 3D is an explanatory view of a comparative example 4.

As shown in FIG. 3D, a circuit board 12" with the insulating layer 34 of the circuit board 12 shown in FIG. 2 being detached (the wiring layer 32 being exposed) is applied. The circuit board 12" does not have the guiding member 16 mounted thereon, and is put in the constant temperature/constant humidity chamber (85° C., 85% (RH)) under the environment conditions set same as those in the example, and a direct voltage of 12 volts is applied to the wiring layer 32.

<Evaluation Result>

No failure (short circuit) occurred during 90 days of use of the circuit board 12 in the example, and therefore if current is continuously applied to the circuit board 12 for a long period of time under the high-humidity/temperature environment, the circuit board 12 has an extremely low chance of having a failure, which ensures long-term reliability.

As compared with this, in the comparative example 1, occurrence of a failure (short circuit) was confirmed after 56 days of use of the circuit board 12. This indicates that the comparative example 1 may have a possibility of attaining a short-term reliability but has difficulty in attaining a long-term reliability.

In the comparative example 2, a failure (short circuit) occurred after 11 days of use of the circuit board 12', and in the comparative example 3, a failure (short circuit) occurred after 3 days of use of the circuit board 12. Further, in the comparative example 4, a failure (short circuit) occurred immediately after the start of use of the circuit board 12". In conclusion, it is presumed that under these conditions, even a short-term reliability is hard to achieve.

When an attention is focused on a difference between the example and the comparative example 1 in particular, the circuit board 12 is put in the dry state in both the example and the comparative example 1. However, the end face 14 of the circuit board 12 is dried in the example, whereas in comparative example 1, a region other than the peripheral portion 24 is dried among the surface 50 and the back surface 52 (principal surface) of the circuit board 12.

In short, the comparative example 1 is largely different from the example in the point that the circuit board 12 in the comparative example 1 is configured with susceptibility to water intrusion since the end face 14 of the circuit board 12 is exposed at the end of the base material 30 and at the end of the insulating layer 34.

Even if the end face 14 of the circuit board 12 is coated with a damp proof material such as resin, an interface is formed between the circuit board 12 and the coating material, and deterioration of the coating material due to long-term use may help an intrusion of water through the interface between the circuit board 12 and the coating material.

In that case, it can be said that a most effective way to prevent the intrusion of water to the inside of the circuit board 12 is to bring the dry gas into direct contact with the end face 14 of the circuit board 12.

[Other Aspects of Guiding Member]

FIGS. 5 to 7 are explanatory views of other aspects of the guiding member 16 shown in FIG. 1. In FIGS. 5 to 7, portions which are the same as or similar to those in FIGS. 1 and 2 are designated with the same reference numerals and further explanation thereof is omitted here. In FIGS. 5 to 7, illustration of the wiring layer 32 and the insulating layer 34 of the circuit board 12 is omitted.

In the aspect shown in FIG. 5, only one side of the circuit board 12 having a square plane shape is covered with a guiding member 16'. In other words, the guiding member 16' has a length and a shape corresponding to one side of the circuit board 12.

More specifically, dry gas is brought into contact with at least a part of the end face 14 of the circuit board 12, which corresponds to a region having particularly high possibility of being high in humidity, so that an intrusion of water to the inside of the circuit board 12 can be prevented.

In the aspect shown in FIG. 6, four sides of the circuit board 12 having a square plane shape are covered with a guiding member 16". The guiding member 16" shown in FIG. 6 has an overall length corresponding to the length of the entire periphery of the circuit board 12, and is configured to have the ends 20 and 22 of FIG. 1 being connected to each other so as to have a shape, as a whole, similar to the plane shape of the circuit board 12.

The guiding member 16" shown in FIG. 6 includes an inlet port 70 and an outlet port 72 for dry gas, which are provided at opposite angle positions on the peripheral portion.

Since the guiding member 16" shown in FIG. 6 covers the entire end face 14 (see FIG. 5, etc.) of the circuit board 12, it becomes possible to more reliably prevent an intrusion of water to the inside of the circuit board 12.

Figure 7A:
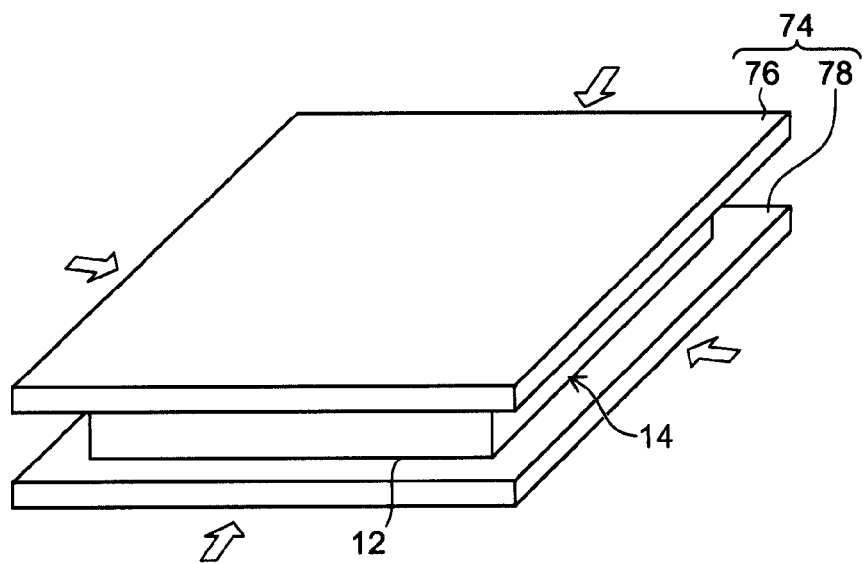
FIGS. 7A and 7B are explanatory views of another aspect of the guiding member shown in FIG. 1.

In a guiding member 74 shown in FIG. 7A, the circuit board 12 is interposed in between two plate-like members 76 and 78, and dry gas is introduced to between the plate-like member 76 and the plate-like member 78.

Figure 7B:
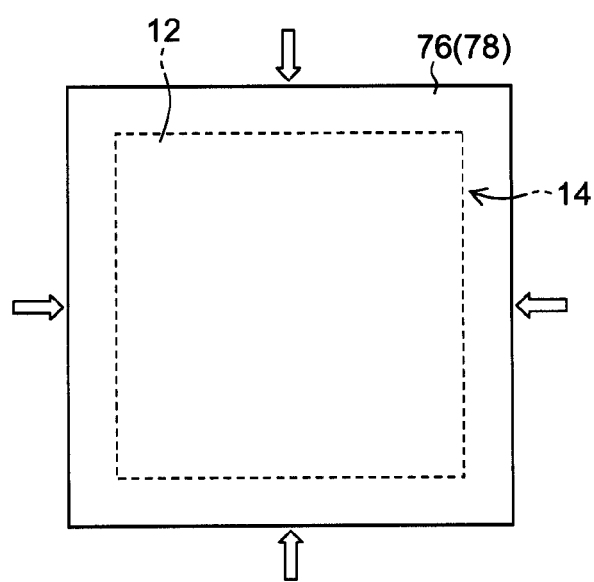

In the aspect shown in FIGS. 7A and 7B, end faces 80 and 82 of the plate-like members 76 and 78 protrude outward from the end face 14 of the circuit board 12, and a space between the plate-like members 76 and 78 functions as a flow channel of dry air.

As shown with an arrow line in FIGS. 7A and 7B, dry gas may be blown to the end face 14 of the circuit board 12 from the position opposite to the end face 14 of the circuit board 12, or dry gas may be passed along the end face 14 of the circuit board 12.

Further, one of the plate-like members 76 and 78 may be configured to have a box shape, so that the circuit board 12 is completely covered.

Although the end faces 80 and 82 of the plate-like members 76 and 78 protrude outward from all the four end faces 14 of the circuit board 12 in the aspect shown in FIGS. 7A and 7B, the end faces 80 and 82 of the plate-like members 76 and 78 have only to protrude outward from at least one face, out of the four end faces 14 of the circuit board 12.

In the circuit device 10 shown in this embodiment, the plane shape of the circuit board 12 is not limited to a square shape. For example, it is possible to apply circuit boards having various plane shapes, such as polygonal shapes other than the square shape, circular shapes, and complicated shapes having vertical angles including obtuse angles and acute angles.

A publicly known dehumidification apparatus is applicable as a device which generates dry gas. For example, the dehumidification apparatus 19 (FIG. 1) explained above can be adopted in this embodiment.

There is also provided a dry gas channel member which is connected to a dry gas inflow port in the guiding member 16 (16', 16", 74). Dry gas is supplied to the inside of the guiding member 16 from the air dryer through the dry gas channel member.

Although the aspect of bringing the dry gas into contact with the end face 14 of the circuit board 12 was shown in this embodiment, it is considered that the same operational effect can be obtained by bringing a solid-state or liquid-state drying agent into contact with the end face 14 of the circuit board 12.

For example, by filling the solid-state or liquid-state drying agent in the guiding member 16 shown in FIG. 1, the periphery of the end face 14 of the circuit board 12 can be dehumidified.

In other words, an intrusion of water from the end face 14 of the circuit board 12 to the inside of the circuit board 12 is prevented by bringing the "dried body", such as dry gas, a liquid-state drying agent (for example, sulfuric acid, ethylene glycol, etc.), and a solid-state drying agent, into contact with the end face 14 of the circuit board 12.

Although the guiding member 16 which has mainly a ring-like sectional shape was shown in this embodiment, various plane shapes, such as polygonal shapes including a square, and complicated shapes having vertical angles including obtuse angles and acute angles, are applicable as the sectional shape of the guiding member 16.

According to the thus-configured circuit device, a dried body is introduced into a space between the guiding member 16 and the end face 14 of the circuit board 12, and movement of the dried body is guided by the guiding member 16, so that the dried body can be brought into contact with the end face 14 of the circuit board 12, and an intrusion of water to the inside of the board is prevented by maintaining the periphery of the end face 14 of the circuit board 12 in a dry state.

On the circuit board 12 which is applied to the circuit device 10 shown in this embodiment, integrated circuits such as an ASIC (Application Specific Integrated Circuit), active elements such as a transistor, passive elements such as a resistor, and connecting members such as a connector may be mounted.

Although the aspect of forming the wiring layer 32 on one surface of the base material 30 was shown in the above example, the wiring layer 32 may be formed on both the surfaces of the base material 30, or a plurality of the wiring layers 32 and the insulating layers may alternately be laminated to constitute a multilayer structure. Configuration examples of the electric connection between wiring layers include those using a through hole and a via.

Further, even in the case where a seal adhesive, or the like, is applied to the end face 14 of the circuit board 12, the configuration shown in this embodiment can also be applied. The end face in such a case serves as the surface of the seal adhesive.

[Application Example of Inkjet Head Assembly]

Next, an example of applying the circuit device 10 described in the foregoing to an inkjet head assembly is described in detail. An inkjet head which is configured to eject liquid, such as ink, from a plurality of nozzles formed on an ink ejection surface (nozzle surface), may have a flexible wiring board disposed in the vicinity of the nozzle surface or in the vicinity of a channel structure.

The vicinity of the nozzle surface and the vicinity of the channel structure may be in an environment higher in humidity than other regions. Accordingly, there is concern about occurrence of a failure attributed to electrochemical migration of the flexible wiring board.

Hereinafter, a description is given of the inkjet head (inkjet head assembly) utilizing the characteristic of the circuit device 10 described in the foregoing.

(Overall Configuration of Inkjet Head Assembly)

Figure 8:
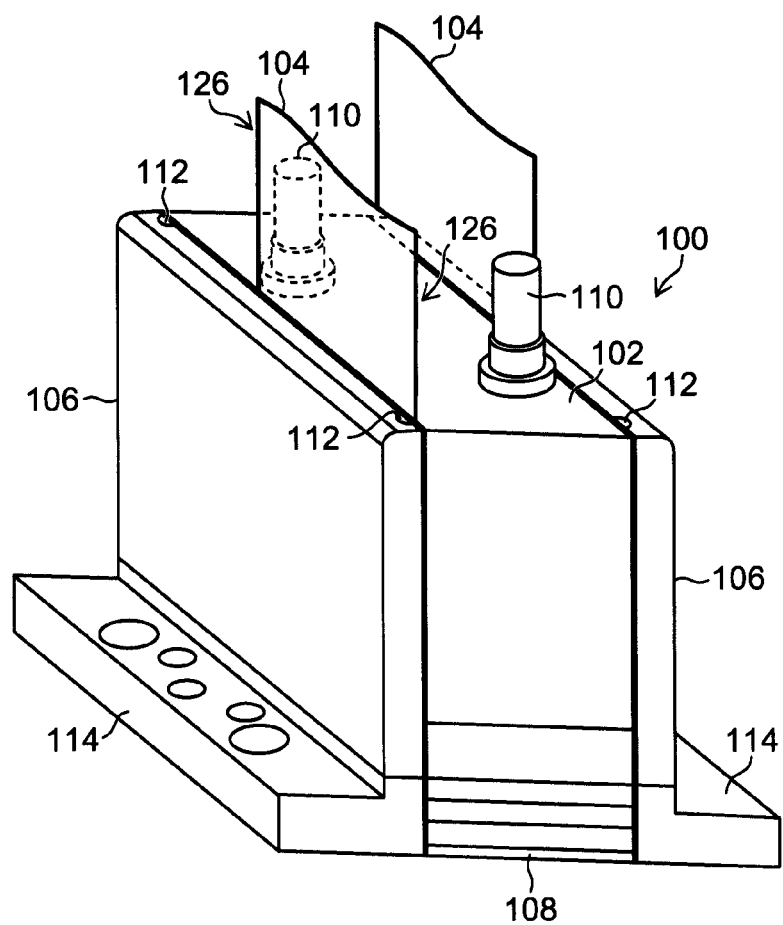
FIG. 8 is a perspective view showing a schematic configuration of an inkjet head assembly according to an embodiment of the present invention.

FIG. 8 is a perspective view showing a schematic configuration of an inkjet head assembly constituting a full line type inkjet head. It is possible to constitute a long line type inkjet head by connecting a plurality of the inkjet head assemblies 100 shown in FIG. 8.

Since the inkjet head assembly 100 is configured so that a single inkjet head assembly 100 can also function as an inkjet head, the inkjet head may be constituted from only one inkjet head assembly 100.

The inkjet head assembly 100 shown in FIG. 8 includes a head body 102, a pair of flexible wiring boards (circuit boards) 104, a pair of mounting frames 106, and the like. As shown in FIG. 8, the flexible wiring board 104 is supported while being interposed in between the head body 102 and the mounting frame 106.

As shown in FIG. 8, the head body 102 includes an ejection die 108 provided on a lowermost portion, and tube connecting nozzles 110 provided on an uppermost portion. One out of the two tube connecting nozzles 110 is for ink supply, while the other is for ink collection.

The tube connecting nozzle 110 for ink supply is made to communicate with an ink supply tank via an ink tube. The tube connecting nozzle 110 for ink collection is made to communicate with an ink collection tank via an ink tube.

The flexible wiring board 104 has a wiring (copper wiring) (shown in FIG. 14 with reference numeral 170) formed as a transmission line of a control signal (command signal) sent out from an unshown control circuit. Note that a wiring for transmitting other signals, such as a sensor signal, may be formed.

An opening 112 that communicates with a dry gas channel (not shown in FIG. 8, shown in FIG. 9 with reference numeral 124) that is formed inside the mounting frame 106 is formed at two places on the mounting frame 106, and a recess portion (not shown in FIG. 8, shown in FIG. 9 with reference numeral 122) corresponding to the thickness of the flexible wiring board 104 is further formed.

A mounting portion 114 is also formed on the mounting frame 106, the mounting portion 114 being used for supporting and positioning purposes at the time of combining a plurality of the inkjet head assemblies 100.

Figure 9:
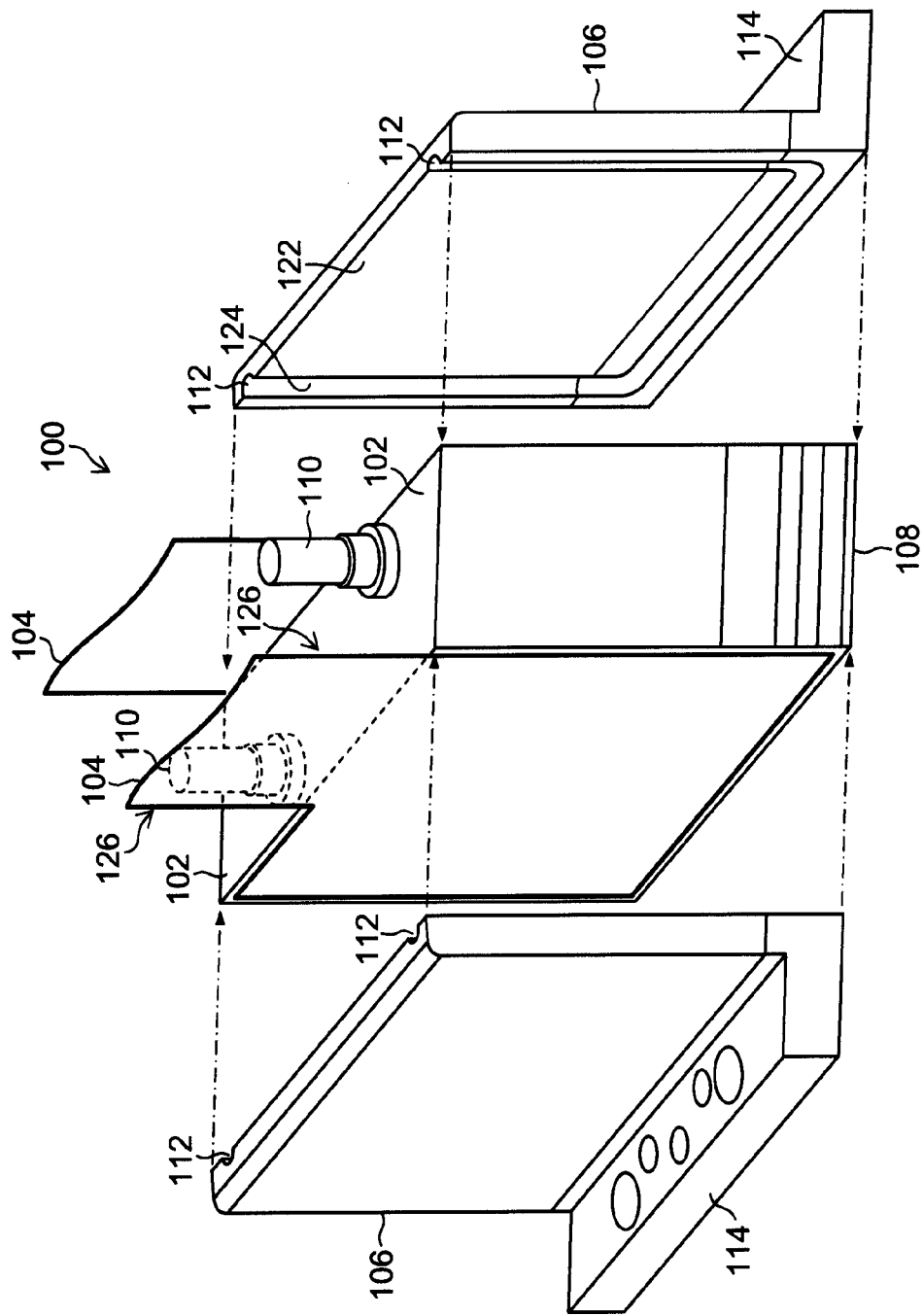
FIG. 9 is an exploded perspective view of the inkjet head assembly shown in FIG. 8.

FIG. 9 is an exploded perspective view of the inkjet head assembly 100 shown in FIG. 8. In the following description, portions which are the same as or similar to those described in the foregoing are designated with the same reference numerals and further explanation thereof is omitted here.

The surface of the mounting frame 106, which comes into contact with the flexible wiring board 104, has a recess portion 122 formed to have a depth corresponding to the thickness of the flexible wiring board 104 for housing the flexible wiring board 104.

A peripheral portion of the recess portion 122 forms a groove portion 124 deeper than other portions, the groove portion 124 functioning as a dry gas channel. When the mounting frame 106 is mounted on the head body 102 while the flexible wiring board 104 is interposed in between the mounting frame 106 and the head body 102, a space is formed between an end face 126 of the flexible wiring board 104 and the mounting frame 106 due to the presence of the groove portion 124 which serves as a dry gas channel.

When dry gas is supplied from the opening 112 while the head body 102, the flexible wiring board 104, and the mounting frame 106 are assembled together, the groove portion 124 is filled with the dry gas, so that the dry gas can be brought into contact with the end face 126 of the flexible wiring board 104. Note that the dry gas described before can be applied as the dry gas. Of course, a liquid or solid dried body may also be applied.

Adhesives are used for joining between the head body 102 and the mounting frame 106, and for joining between the flexible wiring board 104 and the mounting frame 106.

(Description of Each Portion of Head Body)

Figure 10:
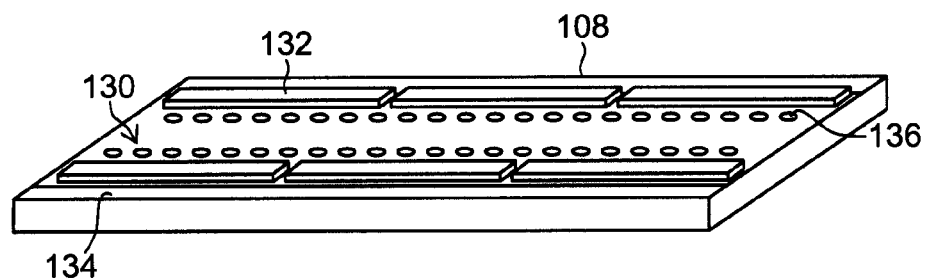
FIG. 10 is a perspective view of an ejection die.

FIG. 10 is a perspective view of the ejection die 108 shown in FIGS. 8 and 9. The ejection die 108 is made of a plate-like member having a parallelogram plane shape, with an ink channel (not shown in FIG. 10, shown in FIG. 11 with reference numeral 146) formed inside the ejection die 108.

Figure 11:
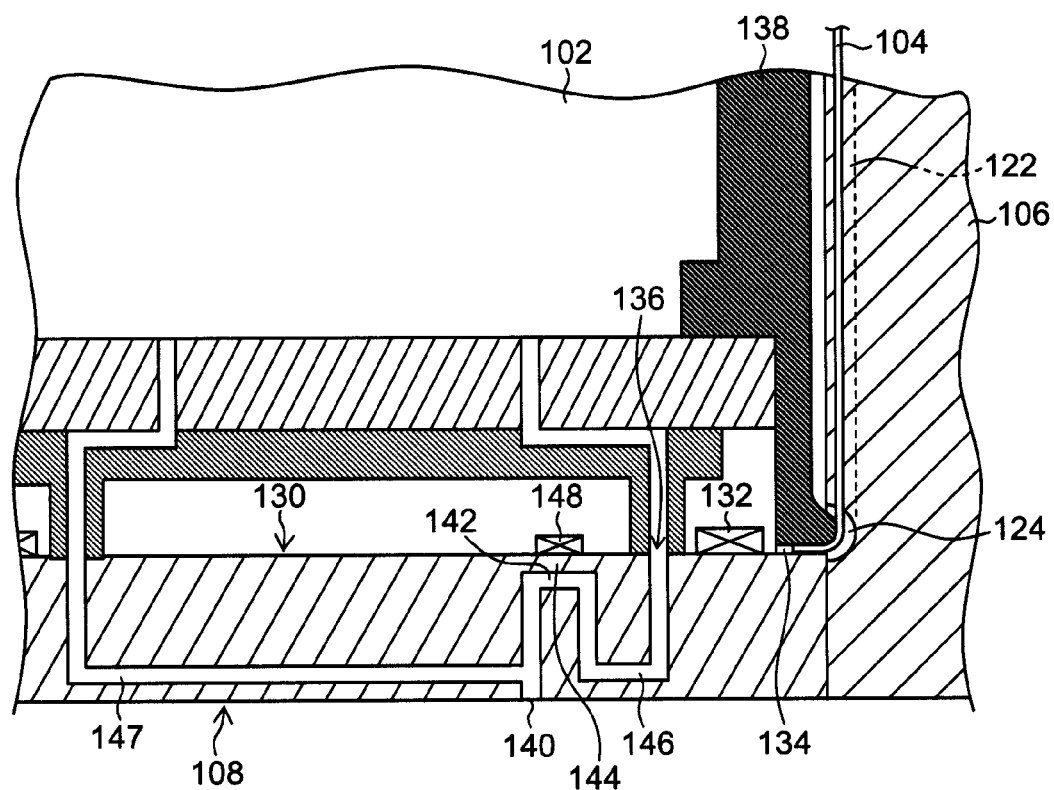
FIG. 11 is a fragmentary sectional view of the inkjet head assembly shown in FIG. 8.

Driving ICs 132 are mounted on an upper surface 130 of the ejection die 108, where an electrical wiring (not shown in FIG. 11, shown in FIG. 12 with reference numeral 152), which is connected to an input output terminal (not shown) of each driving IC 132, and a connection terminal portion 134, which is electrically connected to the electrical wiring and which is connected to the flexible wiring board 104, are formed. Note that a hole illustrated in FIG. 10 with reference numeral 136 is an ink channel opening.

FIG. 11 is a fragmentary sectional view of the inkjet head assembly shown in FIG. 8, in the state where the flexible wiring board 104 and the mounting frame 106 are mounted on the head body 102.

As shown in FIG. 11, there are formed in the ejection die 108, a nozzle 140 for ejecting ink, a pressure chamber 142 for housing the ink to be ejected from the nozzle 140, a diaphragm 144 used as a ceiling surface of the pressure chamber 142, and a supply channel 146 for supplying the ink to the pressure chamber 142.

Figure 13:
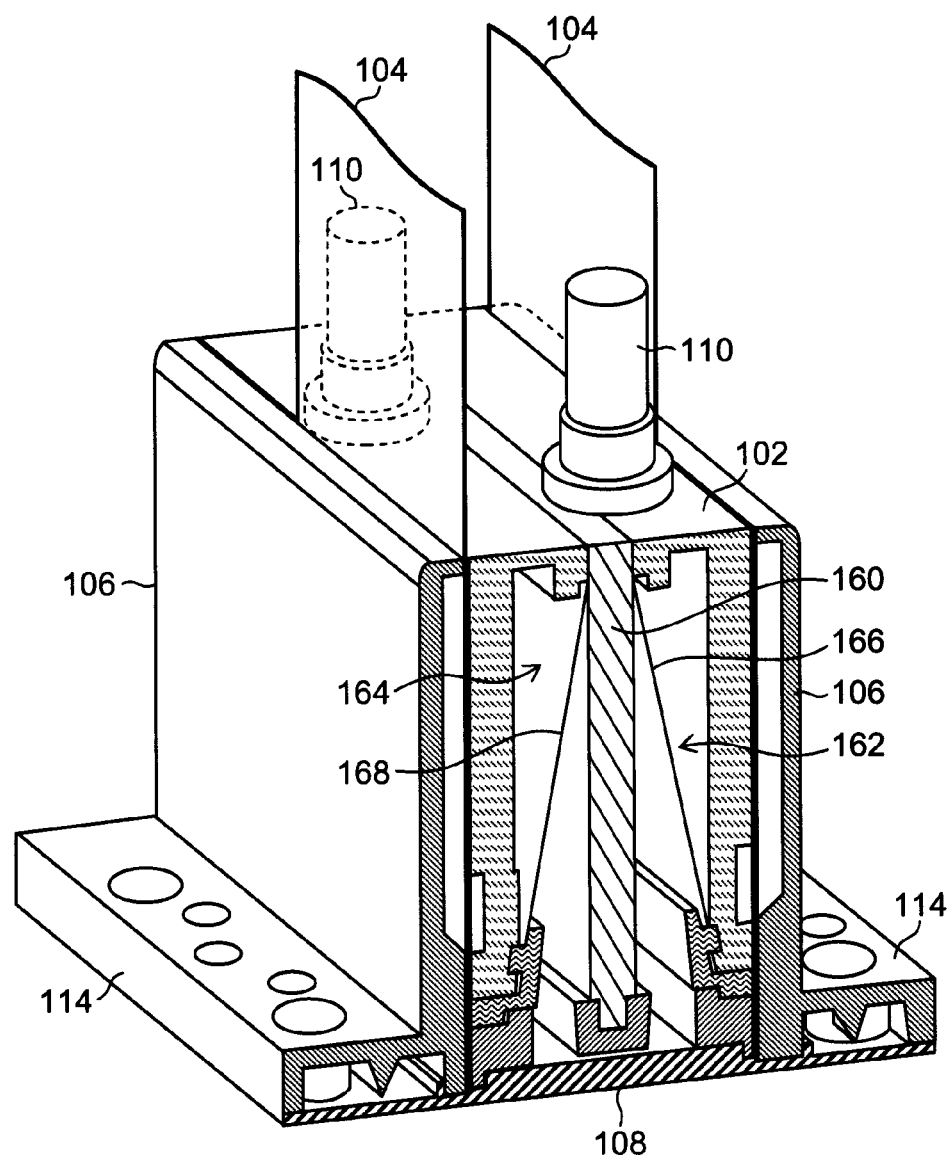
FIG. 13 is a cross sectional view of the inkjet head assembly shown in FIG. 8.

The supply channel 146 is made to communicate with a supply-side filter housing (not shown in FIG. 11, shown in FIG. 13 with reference numeral 162). A circulation channel 147 which branches from the nozzle 140 is made to communicate with a collection-side filter housing (not shown in FIG. 11, shown in FIG. 13 with reference numeral 164).

On the surface of the diaphragm 144 which is opposite to the pressure chamber 142, a piezoelectric element 148 is provided, and a top electrode (not shown) of the piezoelectric element 148 is electrically connected to the driving IC 132 via the electrical wiring.

When a drive voltage is applied from the driving IC 132 to the piezoelectric element 148, the diaphragm 144 is deformed corresponding to flexural deformation of the piezoelectric element 148, so that the ink of a volume corresponding to a decreased volume of the pressure chamber 142 is ejected from the nozzle 140.

Once the piezoelectric element 148 is restored to a stabilizing state, the volume of the pressure chamber 142 is restored to the original volume (shape), and the ink is charged into the pressure chamber 142 via the supply channel 146.

The circulation channel 147 is a channel for circulating ink in the vicinity of the nozzle 140. By suitably circulating the ink in the vicinity of the nozzle 140, thickening of the ink in the vicinity of the nozzle 140 is prevented and a clogging of the nozzle 140 is avoided.

As shown in FIG. 11, the flexible wiring board 104 is curved toward the upper surface 130 of the ejection die 108 in the vicinity of the upper surface 130 of the ejection die 108 and is joined to the connection terminal portion 134 formed on the upper surface 130 of the ejection die 108.

Once the connection terminal portion 134 is joined to the flexible wiring board 104, a support body 138, or the like, is mounted on the ejection die 108 to complete the head body 102.

Moreover, the flexible wiring board 104 and the recess portion 122 of the mounting frame 106 are aligned, and in the state where the flexible wiring board 104 is housed in the recess portion 122 of the mounting frame 106, the mounting frame 106 is mounted on the head body 102.

Figure 12:
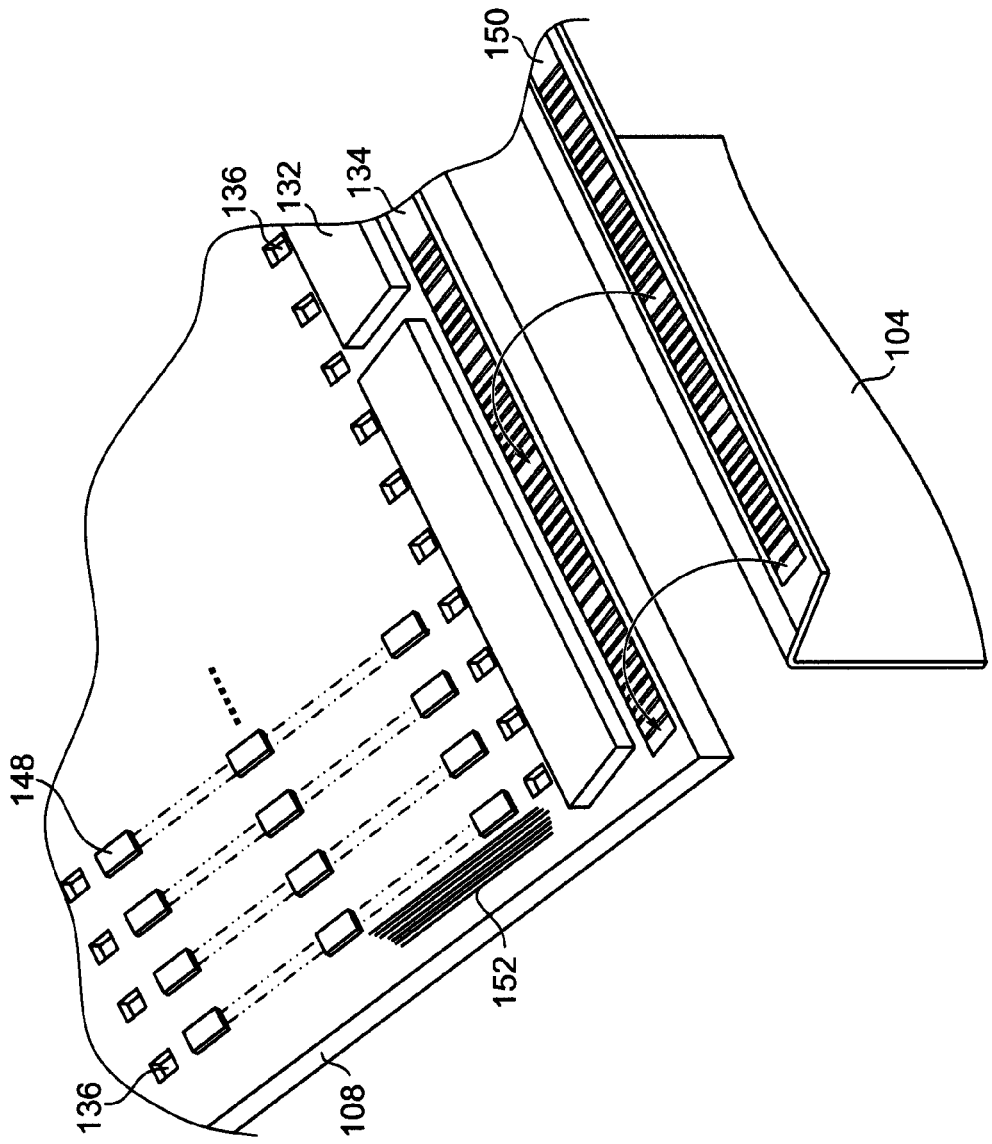
FIG. 12 is an explanatory view of a connecting configuration between the ejection die and a flexible wiring board.

FIG. 12 is an explanatory view of a connecting configuration between the ejection die 108 and the flexible wiring board 104. As shown in FIG. 12, the connection terminal portion 150 is formed on the flexible wiring board 104, and the connection terminal portion 150 is joined to the connection terminal portion 134 of the ejection die 108.

A joining member having conductivity, such as a solder and an electrically conductive adhesive, is used for joining between the connection terminal portion 150 of the flexible wiring board 104 and the connection terminal portion 134 of the ejection die 108.

On the upper surface 130 of the ejection die 108, the ink channel opening 136 and the piezoelectric element 148 are provided, and the electrical wiring 152 is formed for transmitting a drive voltage which is applied to the piezoelectric element 148.

Although the piezo-electric method using flexural deformation of the piezoelectric element 148 was shown as an ink ejection method of the inkjet head assembly 100 in this embodiment, it is also possible to apply other ejection methods, such as a thermal method which heats ink in the pressure chamber 142 with a heater provided inside the pressure chamber (liquid chamber) 142 and ejects the ink by utilizing a film boiling phenomenon.

(Description of Channel Structure of Head Body)

FIG. 13 is a cross sectional view of the inkjet head assembly shown in FIG. 8. As shown in FIG. 13, the head body 102 has a supply-side filter housing 162 provided on one side and a collection-side filter housing 164 provided on the other side across a divider plate 160.

The respective filter housings 162 and 164 house filters 166 and 168 made of stainless steel in a diagonal direction of respective chambers.

(Description of Method for Connecting Flexible Wiring Board and Ejection Die)

Figure 14A:
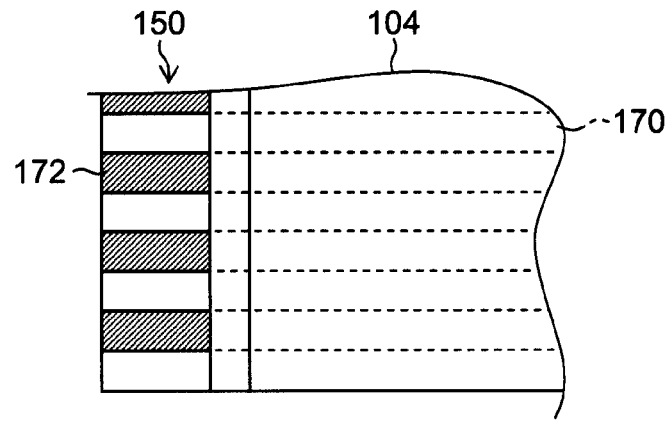
FIG. 14A is a bottom view of the flexible wiring board.
Figure 14B:
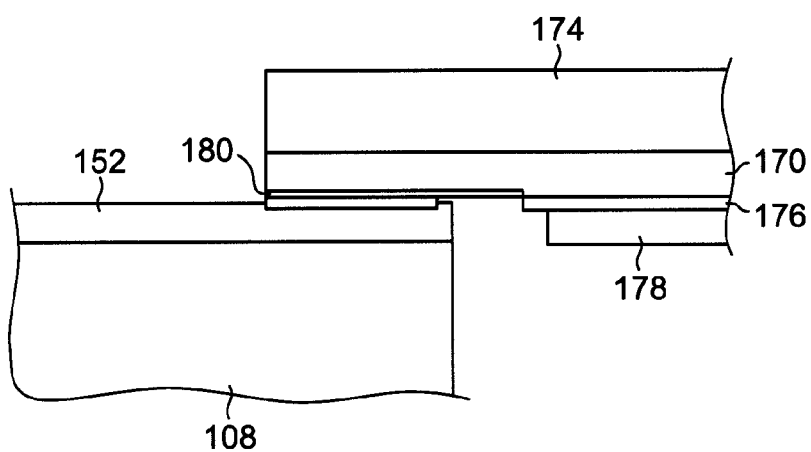
FIG. 14B is a cross sectional view of the ejection die and the flexible wiring board in a connected state.
Figure 14C:
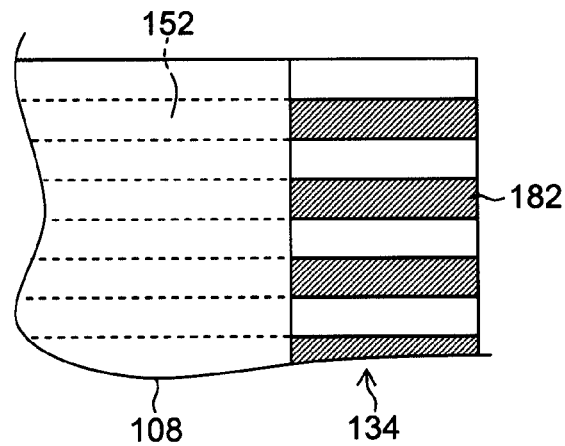
FIG. 14C is a plan view of the ejection die.

FIG. 14A is a bottom view of the flexible wiring board 104, and FIG. 14B is a cross sectional view of the ejection die 108 and the flexible wiring board 104 in a connected state. FIG. 14C is a plan view of the ejection die.

As shown in FIG. 14A, the flexible wiring board 104 is configured so that an insulating layer made of polyimide (shown in FIG. 14B with reference numeral 174) is provided with a copper wiring 170 (shown with a broken line), and a region excluding the connection terminal portion 150 is bonded to a protective layer made of polyimide (shown in FIG. 14B with reference numeral 178) via an adhesive layer (shown in FIG. 14B with reference numeral 176).

The insulating layer 174 in the flexible wiring board 104 applied in this embodiment has a thickness of 25 micrometers, while the adhesive layer 178 has a thickness of 17.5 micrometers.

As the copper wiring 170, a copper alloy may be applied, and other metallic materials having high electric conductivity, such as gold, may also be applied. The copper wiring 170 in the flexible wiring board 104 applied in this embodiment has a thickness of 12 micrometers.

The surface of each connection terminal 172 in the connection terminal portion 150 of the flexible wiring board 104 is plated with solder, gold, and tin to facilitate connection to the connection terminal portion 134 of the ejection die 108. The plated material dissolves at the time of joining by heat pressing, so that each connection terminal 172 in the connection terminal portion 150 of the flexible wiring board 104 is integrated with each connection terminal (shown in FIG. 14C with reference numeral 182) in the connection terminal portion 134 of the ejection die 108.

As shown in FIG. 14B, the connection terminal portion 150 (see FIG. 14A) of the flexible wiring board 104 is joined to the connection terminal portion 134 (see FIG. 14C) of the ejection die 108. As the joining method, soldering by heat pressing is applied.

More specifically, a copper ion diffusion suppression coating 180 is formed on the flexible wiring board 104. Then, the connection terminal portion 150 of the flexible wiring board 104 is aligned with the connection terminal portion 134 of the ejection die 108, and as shown in FIG. 14B, the flexible wiring board 104 and the ejection die 108 are joined together.

(Description of Internal Configuration of Mounting Frame)

Figure 15:
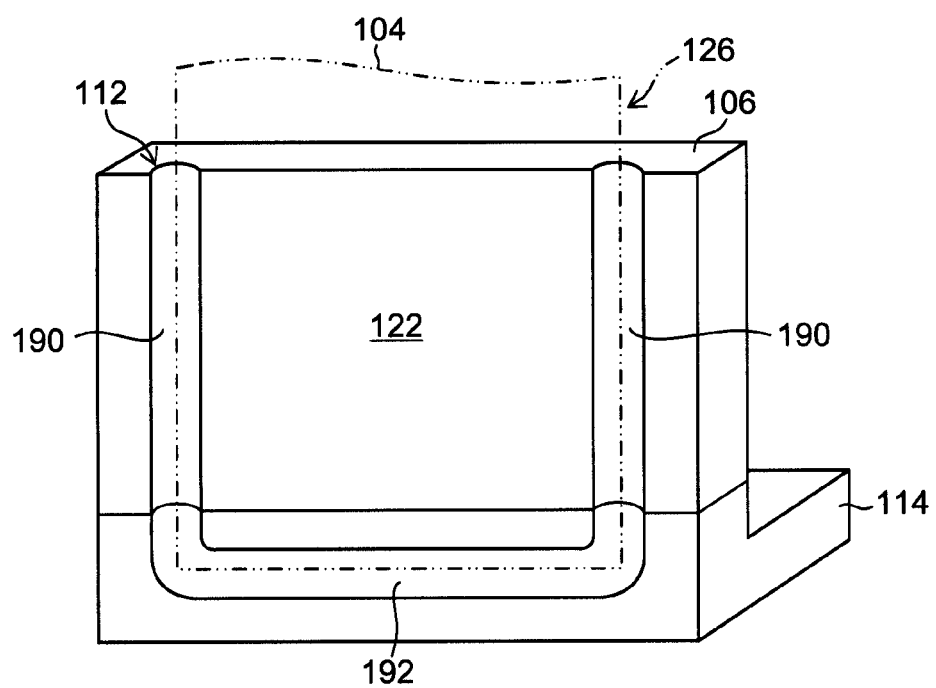
FIG. 15 is a perspective view showing an internal configuration of a mounting frame of FIG. 9.

Next, an internal configuration of the mounting frame 106 is described in detail. FIG. 15 is a perspective view showing an internal configuration of the mounting frame 106. In FIG. 15, the flexible wiring board 104 in a housed state is shown with a dashed line. The flexible wiring board 104 in the housed state is curved toward the near side on the page, and is joined to the ejection die 108 (see FIG. 11).

The mounting frame 106 shown in FIG. 15 has the recess portion 122 provided on the surface which faces the head body 102 (see FIG. 13). The recess portion 122 has a shape corresponding to the shape of the flexible wiring board 104, has a size slightly smaller than the size of the flexible wiring board 104, and has a depth corresponding to the thickness of the flexible wiring board 104.

Two vertical groove portions 190 and one horizontal groove portion 192 (in FIG. 9, the vertical groove portions 190 and the horizontal groove portion 192 are generically referred to as the groove portion which is designated with reference numeral 124) which function as a dry gas channel are formed on the periphery of the recess portion 122. The opening 112 is formed at an upper end of each vertical groove portion 190 and is made to communicate with the horizontal groove portion 192 at the lower end.

In the state where the mounting frame 106 is mounted on the head body 102 to support the flexible wiring board 104, a space is formed in the periphery of the end face 126 of the flexible wiring board 104. If dry air is introduced from the opening 112 in this state, the space formed in the periphery of the end face 126 of the flexible wiring board 104 is filled with the dry air, so that the dry air can be brought into contact with the end face 126 of the flexible wiring board 104.

Since the vicinity of the ejection die 108 is in a high-humidity environment due to the presence of ink in particular, an intrusion of water to the inside of the flexible wiring board 104 is prevented in the vicinity of the ejection die 108 that is in the high-humidity environment, and occurrence of a failure due to a short circuit of the copper wiring 170 formed on the flexible wiring board 104 is avoided.

(Description of Another Internal Configuration Example of Mounting Frame)

FIGS. 16A and 16B are perspective views showing another internal configuration example of the mounting frame 106 shown in FIG. 15. A mounting frame 106' shown in FIGS. 16A and 16B has a dual structure having a first mounting frame 194 (first guiding member) that functions as a flexible wiring board support member and a second mounting frame 196 (second guiding member) that has a dry gas introduction channel formed thereon.

On the first mounting frame 194, a lower end portion (shown with reference numeral 190') of the vertical groove portion 190 shown in FIG. 15 and the horizontal groove portion 192 are formed. There is also formed a first dry gas introduction channel 198 (through hole) which penetrates the first mounting frame 194 in a thickness direction and which communicate with at least one of the vertical groove portion 190' and the horizontal groove portion 192.

On the second mounting frame 196, a second dry gas introduction channel 199 (hole) is formed at a position corresponding to the first dry gas introduction channel 198, and the second dry gas introduction channel 199 communicates with an unshown dry gas inlet port.

When the mounting frame 106' having such configuration is mounted, dry gas is introduced intensively to the vicinity of the ejection die 108 which has high possibility of being high in humidity, so that a sufficient dry state is effectively maintained.

In the inkjet head assembly 100 described in the foregoing, as in the case of the circuit device 10 previously described, a liquid-state dried body and a solid-state dried body may suitably be applied in place of or in combination with the dry gas.

(Description of Nozzle Arrangement)

FIG. 17 is a perspective plan view showing a nozzle arrangement of the inkjet head assembly 100. FIG. 17 is a view of the surface on which ejected liquid is deposited as viewed from the inkjet head assembly 100.

As shown in FIG. 17, the inkjet head assembly 100 is configured to have nozzles 140 arranged in a two-dimensional way. The inkjet head having such an arrangement of the nozzles 140 is called a matrix head.

The inkjet head assembly 100 shown in FIG. 17 is configured to have a large number of the nozzles 140 arrayed along a column direction W having an angle α with respect to a sub-scanning direction Y and along a row direction V having an angle β with respect to a main scanning direction X, and substantially has high-density (for example, 1200 dots per inch) nozzle arrangement in the main scanning direction X.

In FIG. 17, a nozzle group (nozzle row) arrayed along the row direction V is illustrated and designated with reference numeral 200, while a nozzle group (nozzle column) arrayed along the column direction W is illustrated and designated with reference numeral 202.

It is to be noted that the nozzle arrangement applicable to the present invention is not limited to the nozzle arrangement shown in FIG. 17. For example, the nozzle arrangement is also applicable to an aspect in which a plurality of nozzles are arrayed in a matrix form along the row direction in the main scanning direction and along the column direction which is slant with respect to the main scanning direction.

(Configuration Example of Inkjet Head)

Figure 18:
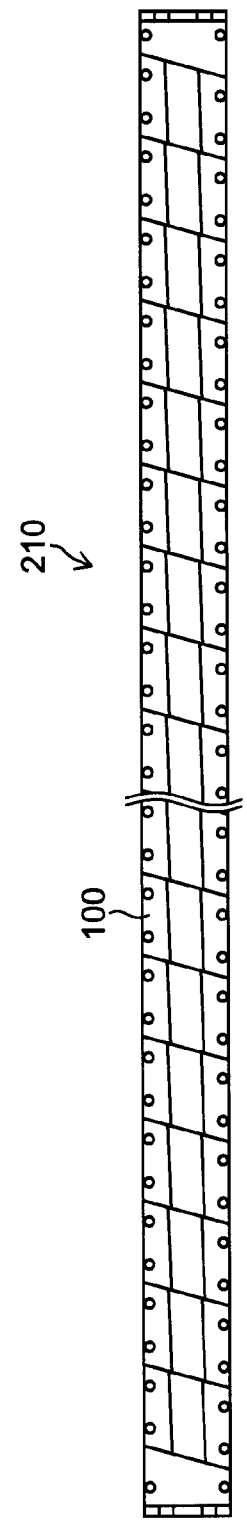
FIG. 18 is a plan view showing a configuration example of an inkjet head constituted of a plurality of inkjet head assemblies connected to each other.

FIG. 18 is a plan view showing a configuration example of an inkjet head constituted of a plurality of the inkjet head assemblies 100 which are connected to each other.

An inkjet head 210 shown in FIG. 18 is a multi head constituted of a plurality of the inkjet head assemblies 100 connected in one line. It is also possible to constitute a multi head by arranging the inkjet head assemblies 100 in a staggered form.

Application examples of the multi head constituted of a plurality of the inkjet head assemblies 100 include a full line-type head which corresponds to the overall width of a recording medium. The full line-type head is configured to have a plurality of nozzles (shown in FIG. 11 with reference numeral 140) arrayed along a direction (main scanning direction) orthogonal to a moving direction (sub-scanning direction) of the recording medium, corresponding to the length (width) of the recording medium in the main scanning direction.

An image can be formed over the entire surface of the recording medium by a so-called single pass image recording method which carries out image recording with only one scanning action which is relatively conducted by the above-configured inkjet head 210 and the recording medium.

The inkjet head 210 shown in this embodiment is widely applicable to apparatuses which support the inkjet method, such as an inkjet recording apparatus which forms a color image on a recording medium, and a liquid ejection apparatus which ejects functional liquid on a substrate to form a mask pattern and an electrical wiring pattern.

One configuration example of the inkjet recording apparatus includes a recording medium conveyance device which relatively conveys an inkjet head and a recording medium; an ejection control unit which controls ink ejection from the inkjet head, an image processing unit which generates ink ejection data based on input image data, and a driving signal generation unit which generates a driving signal applied to the inkjet head based on ejection data.

This configuration example may further include a dry gas generation unit previously explained and a dry gas channel member used as a dry gas channel, so that dry gas is supplied from the dry gas generation unit to the inkjet head via the dry gas channel member.

The flexible wiring board is applied as a transmission member for transmitting signals, such as a control signal sent from a control system provided in the outside of the inkjet head to the inkjet head, and a detection signal sent from sensors of the inkjet head to the control system.

By applying the flexible wiring board as an electrical wiring which transmits an electrical signal between the inkjet head and the outside, the space for disposing the electrical wiring can be saved.

According to the inkjet head assembly configured as described above, the wiring 170, which transmits a driving signal (control signal) which is applied to a piezoelectric element that functions as a pressure generation element at the time of ejection operation, is formed on the flexible wiring board 104, and dry air is brought into contact with the end face 126 of the flexible wiring board 104. Accordingly, even when the flexible wiring board 104 is placed under a high-humidity environment in the vicinity of the nozzle and in the vicinity of the flow channel, a short circuit between wirings, attributed to electrochemical migration caused by an intrusion of water to the inside of the flexible wiring board 104, is prevented.

Drying performance in the circuit device and in the inkjet head assembly described in the forgoing may be controlled by adjusting a flow rate of the dry gas so as to attain a preset humidity, or by providing a moisture sensor to adjust the flow rate so as to attain a humidity set based on the detection result.

Suitable additions, modifications, and deletion of component members in the above-described circuit device and inkjet head assembly are possible without departing from the spirit of the present invention.

[Invention Disclosed in this Specification]

As is understood from the detailed foregoing description of the embodiment of the present invention, this specification includes disclosure of various technical concepts including at least the aspects described as shown below.

(First aspect): A circuit device, including: a circuit board which has one or more wiring layers formed on a base material and has an insulating layer laminated on a surface of the one or more wiring layers opposite to the base material; and a guiding member which is configured to encircle at least a part of an end face of the circuit board so that a space is formed with the end face and to guide movement of a dried body which is supplied to the formed space.

According to this aspect, the dried body is brought into contact with the end of the circuit board while movement of the dried body is guided by the guiding member, so that an intrusion of water (moisture) to the inside from the end face of the circuit board is prevented, and occurrence of a failure attributed to a short circuit between wirings resulting from electrochemical migration is prevented.

The dried body, which is a concept including a gas, a liquid, and a solid, has a function of keeping the atmosphere on the end face of the circuit board in a dry state.

The aspect is applicable to all the single-sided board in which a wiring layer is formed only on one surface of the base material, the double-sided board in which a wiring layer is formed on both one surface of the base material and the other surface which is opposite to the one surface, and the multilayer board which includes a plurality of wiring layers and an insulating layer formed between the respective wiring layers.

(Second aspect): The circuit device according to the first aspect, wherein the dried body is a dry fluid, and a dry fluid supply device is provided to supply the dry fluid to the space inside the guiding member.

According to the aspect, by supplying the dry fluid to the inside of the guiding member, the dry fluid is brought into contact with the end face of the circuit board, so that the atmosphere on the end face of the circuit board is maintained in a dry state.

Dry fluid is a concept including a gas and a liquid, and examples of the dry fluid include a gas in a low humidity state.

(Third aspect): The circuit device according to the second aspect, wherein the dry fluid is dry gas having a humidity less than a humidity around the circuit board.

According to this aspect, by setting the humidity of the atmosphere on the end face of the circuit board to be less than the humidity of the atmosphere around the circuit board, the atmosphere on the end face of the circuit board is maintained in a dry state.

(Fourth aspect): The circuit device according to any of the first to third aspects, wherein a hollow structure is provided, and a notch portion for sandwiching the circuit board is formed.

According to the aspect, by supplying (charging) the dried body to the inside of the hollow structure, the inside of the hollow structure, i.e., the circumferential atmosphere on the end face of the circuit board is maintained in a dry state.

(Fifth aspect): The circuit device according to any of the first to fourth aspects, wherein the circuit board has a polygonal plane shape, and the guiding member is configured to cover at least one side out of a plurality of sides of the circuit board.

In this aspect, it is preferable to cover the end face which is put in a high-humidity state with the guiding member.

(Sixth aspect): The circuit device according to any of the first to fifth aspects, wherein the guiding member is configured to cover an entire periphery of the circuit board.

According to this aspect, since the dried body can be brought into contact with the entire periphery of the end face of the circuit board, the entire periphery of the end face of the circuit board can be maintained in a desirable dry state.

(Seventh aspect): The circuit device according to any of the first to third aspects, wherein the guiding member includes a plurality of members which sandwich the circuit board from one surface of the circuit board and from the other surface opposite to the one surface, and at least a part of the end face of the plurality of members is configured to protrude outward from the end face of the circuit board.

In this aspect, there may be an aspect in which a plurality of members are formed into plate-like members. There may also be an aspect in which one member is a plate-like member while the other member is a box-like member so that the entire circuit board is covered.

(Eighth aspect): The circuit device according to any of the first to seventh aspects, wherein the circuit board has the wiring layer formed on the one surface of the base material and on the other surface opposite to the one surface.

According to this aspect, also in the double-sided board which includes a wiring layer provided on both the surfaces of the base material and an insulating layer that is laminated on the wiring layer, an intrusion of water (moisture) to the inside from the end face of the circuit board is prevented, and occurrence of a failure attributed to a short circuit between wirings resulting from electrochemical migration is prevented.

(Ninth aspect): The circuit device according to any of the first to eighth aspects, wherein a plurality of the wiring layers are provided, and a layer for insulation is formed between the respective wiring layers.

According to this aspect, also in the multilayer board which includes a plurality of wiring layers laminated and a layer for insulation formed between the respective wiring layers, an intrusion of water (moisture) to the inside from the end face of the circuit board is prevented, and occurrence of a failure attributed to a short circuit between wirings resulting from electrochemical migration is prevented. The plurality of wiring layer may be layered in vertical direction. In this aspect, a layer for insulation may be the insulating layer according to any of the above one to eighth aspects.

(Tenth aspect): An inkjet head assembly constituting an inkjet head which is provided with nozzles for ejecting liquid, the inkjet head assembly comprising: an electrical wiring; an extraction electrode which is electrically connected to the electrical wiring; and a circuit device which includes a circuit board joined to the extraction electrode, wherein the circuit device is a circuit device according to any one of the above one to ninth aspects.

According to this aspect, even in the case where the circuit board is disposed in a high-humidity environment, such as in the vicinity of a liquid ejection unit and in the vicinity of a liquid channel portion, bringing the dried body into contact with the end face of the circuit board makes it possible to maintain a desirable dry state, so that an intrusion of water (moisture) to the inside from the end face of the circuit board is prevented, and occurrence of a failure attributed to a short circuit between wirings resulting from electrochemical migration is prevented.

The inkjet head assembly is configured so that a single inkjet head assembly may function as an inkjet head and also a plurality of inkjet head assemblies may be connected to constitute an inkjet head.

(Eleventh aspect): The inkjet head assembly according to the tenth aspect, further including: a liquid chamber which is configured to communicate with the nozzles; and a pressure application element which is configured to apply pressure to liquid housed in the liquid chamber, wherein the electrical wiring is configured to transmit a driving signal for operating the pressure application element.

Examples of the pressure application element in the aspect include a piezoelectric element which is flexurally deformed by application of a drive voltage.

(Twelfth aspect): The inkjet head assembly according to the eleventh aspect, further including; a main body unit which is configured to have the liquid chamber formed therein; and a support member which is configured to support the main body unit, wherein the circuit board is configured to be supported by the support member between the main body unit and the support member, the support member is configured to also function as the guiding member, and a groove portion is formed on a surface which comes into contact with the circuit board as a space which guides movement of the dried body.

In this aspect, there may be an aspect in which a groove or a recess portion is formed inside the support member and is used as a housing portion of the circuit board or as a passage of the dried body.

(Thirteenth aspect): The inkjet head assembly according to the twelfth aspect, wherein the guiding member which is configured to also serve as the support member includes: a first guiding member (194) on which the groove portion is formed to encircle a part of a periphery of the circuit board, and which has a through hole formed to communicate with the groove portion and penetrate in a thickness direction; and a second guiding member which is configured to have a hole formed to communicate with the through hole.

In this aspect, an aspect of forming on the first guiding member a housing portion for housing the circuit board separately from the groove portion that serves as the passage of the dried body is preferable.

Moreover, an aspect of forming the groove portion of the first guiding member corresponding to a position which is particularly in a high-humidity state is preferable.

(Fourteenth aspect): The inkjet head assembly according to any of the tenth to thirteenth aspects, wherein the circuit board is a flexible wiring board which uses a resin film as the base material so as to have flexibility.

According to this aspect, the circuit board may be disposed in a clearance formed in the inkjet head assembly configuration, so that the space between the inkjet head assembly and the outside for disposing electrical wiring may be saved.

(Fifteenth aspect): The inkjet head assembly according to the tenth to fourteenth aspects, wherein the dried body is a dry fluid, and a dry fluid supply device is provided to supply the dry fluid to the space inside the guiding member. (Sixteenth aspect): The inkjet head assembly according to the fifteenth aspect, wherein the dry fluid is dry gas having a humidity less than a humidity around the circuit board.

What is claimed is:
1. A circuit device, comprising:
    a circuit board which has one or more wiring layers formed on a base material and has an insulating layer laminated on a surface of the one or more wiring layers opposite to the base material; and
    a guiding member which has a notch portion configured to sandwich the circuit board and has a hollow structure in a cylindrical shape configured to encircle at least a part of an end face of the circuit board sandwiched in the notch portion so that a space is formed with the end face and to guide movement of a dried body which is supplied to the formed space.
2. The circuit device according to claim 1, wherein
    the dried body is a dry fluid, and
    a dry fluid supply device is provided to supply the dry fluid to the space inside the guiding member.
3. The circuit device according to claim 2, wherein the dry fluid is dry gas having a humidity less than a humidity around the circuit board.
4. The circuit device according to claim 1, wherein
    the circuit board has a polygonal plane shape, and
    the guiding member is configured to cover at least one side out of a plurality of sides of the circuit board.
5. The circuit device according to claim 1, wherein the guiding member is configured to cover an entire periphery of the circuit board.
6. The circuit device according to claim 1, wherein
    the guiding member includes a plurality of members which sandwich the circuit board from one surface of the circuit board and the other surface opposite to the one surface, and
    at least a part of the end face of the plurality of members is configured to protrude outward from the end face of the circuit board.
7. The circuit device according to claim 1, wherein the circuit board has the wiring layer formed on the one surface of the base material and on the other surface opposite to the one surface.
8. The circuit device according to claim 1, wherein a plurality of the wiring layers are provided, and a layer for insulation is formed between the respective wiring layers.
9. The circuit device according to claim 1, wherein the guiding member is U-shaped.
10. The circuit device according to claim 1, wherein the guiding member consists of one piece.
11. The circuit device according to claim 1, wherein the guiding member has a ring shaped cross section with a part of the ring shape being missing.

* * * * *